(12) United States Patent
Nakai et al.

(10) Patent No.: US 8,419,924 B2
(45) Date of Patent: Apr. 16, 2013

(54) WIRING SUBSTRATE AND METHOD FOR MANUFACTURING WIRING SUBSTRATE

(75) Inventors: Toru Nakai, Ogaki (JP); Liyi Chen, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 128 days.

(21) Appl. No.: 12/827,343

(22) Filed: Jun. 30, 2010

(65) Prior Publication Data

US 2011/0000708 A1 Jan. 6, 2011

(30) Foreign Application Priority Data

Jun. 30, 2009 (JP) ................................. 2009-155402

(51) Int. Cl.
*C25F 3/14* (2006.01)
*C25D 11/02* (2006.01)

(52) U.S. Cl.
USPC ............................. 205/667; 205/324; 205/666

(58) Field of Classification Search .................. 205/324, 205/666, 667
See application file for complete search history.

(56) References Cited

U.S. PATENT DOCUMENTS

| 6,448,510 | B1 * | 9/2002 | Neftin et al. ................... 174/264 |
| 6,670,704 | B1 * | 12/2003 | Neftin et al. ................... 257/696 |
| 6,806,542 | B1 * | 10/2004 | Zhang et al. ................... 257/411 |
| 6,899,815 | B2 | 5/2005 | Coomer et al. |
| 2003/0164350 | A1 * | 9/2003 | Hanson et al. ..................... 216/2 |
| 2010/0255274 | A1 * | 10/2010 | Mirsky et al. ................. 428/209 |

* cited by examiner

*Primary Examiner* — Nicholas A. Smith
(74) *Attorney, Agent, or Firm* — Oblon, Spivak, McClelland, Maier & Neustadt, L.L.P.

(57) ABSTRACT

[Subject Matter] To provide a method for manufacturing a wiring substrate where rigidity is enhanced in an insulative portion made by oxidizing aluminum.
[Solution(s)] Aluminum oxide insulative portion 24 is formed on aluminum plate 20 as shown in FIG. 1(A) through anodic oxidation (FIG. 1(C)). Then, holes (nano-holes) (24*h*) in aluminum oxide 24 are filled with resin 30 (FIG. 1(E)). Accordingly, the rigidity (strength) of insulative portion 24 will be enhanced and cracking will not occur during heat cycles. Also, the insulation reliability of aluminum oxide will increase, and short circuiting may be prevented at through holes 26 (aluminum portions) separated by aluminum oxide 24.

16 Claims, 15 Drawing Sheets

Fig. 2
(A)
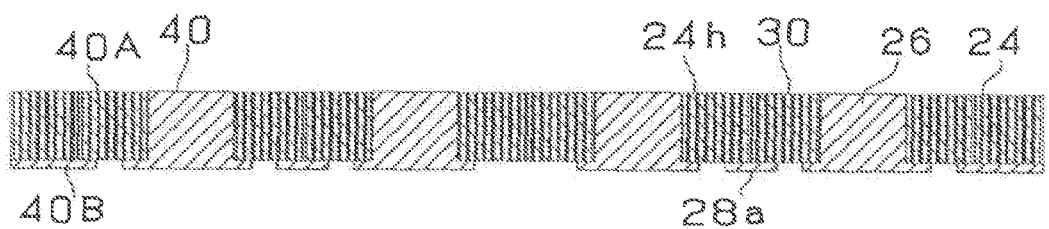
(B)
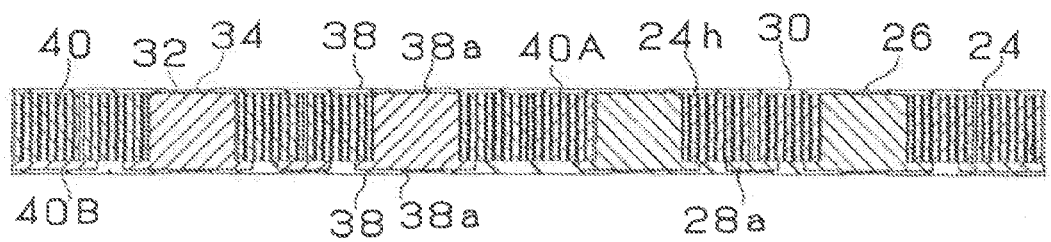
(C)
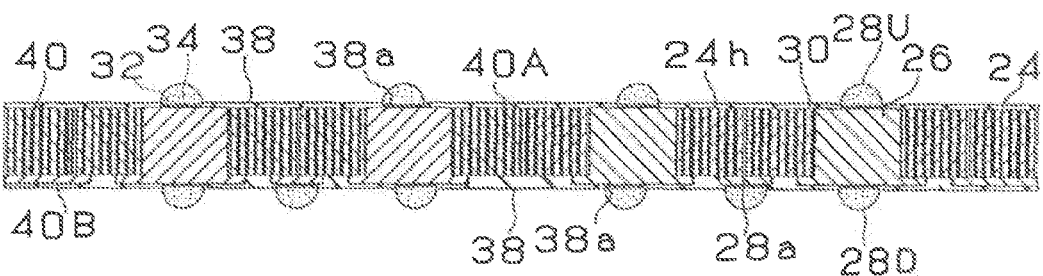

Fig. 7
(A)
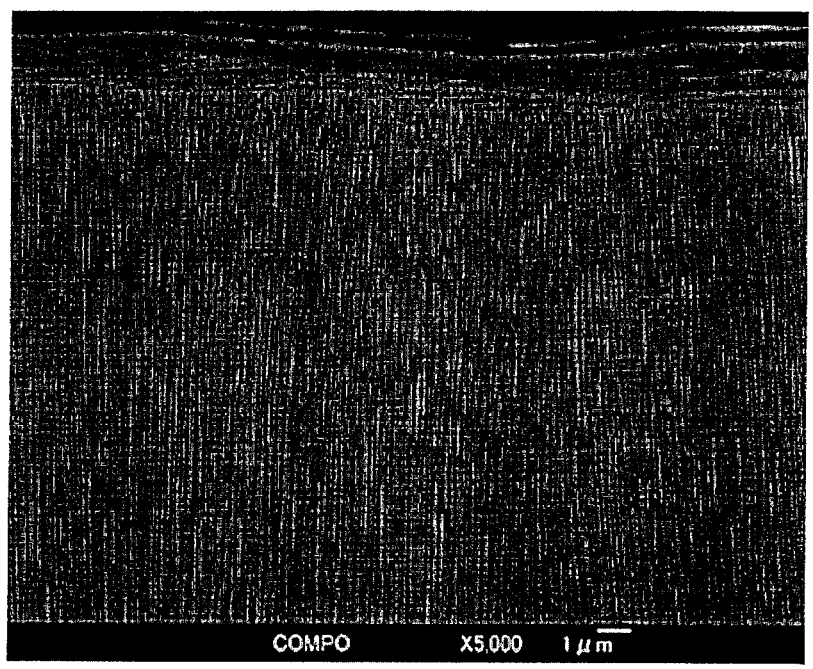
(B)
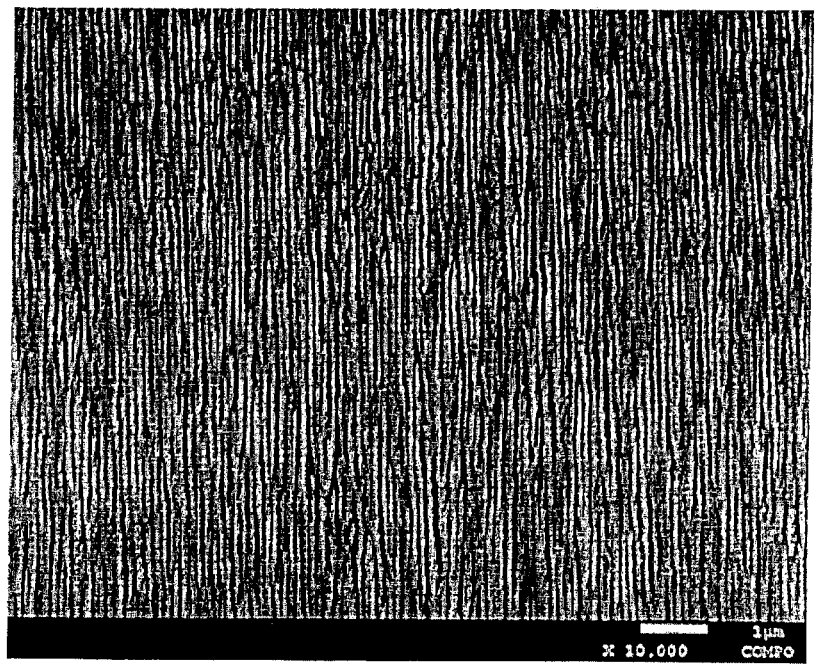

Fig. 8
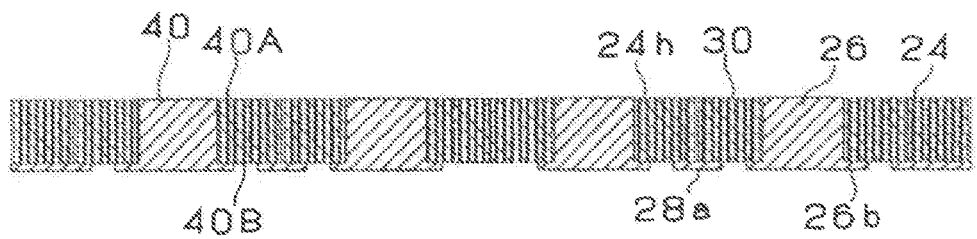
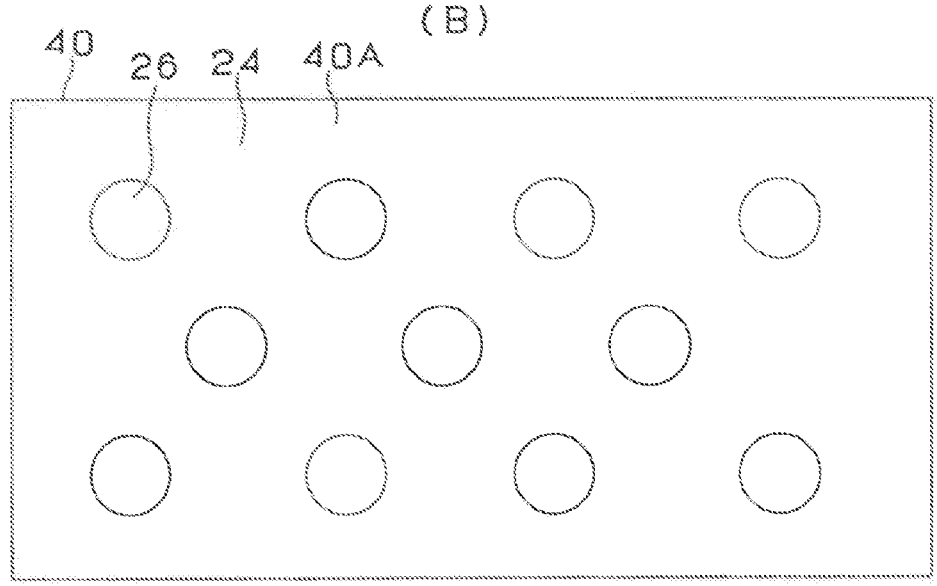
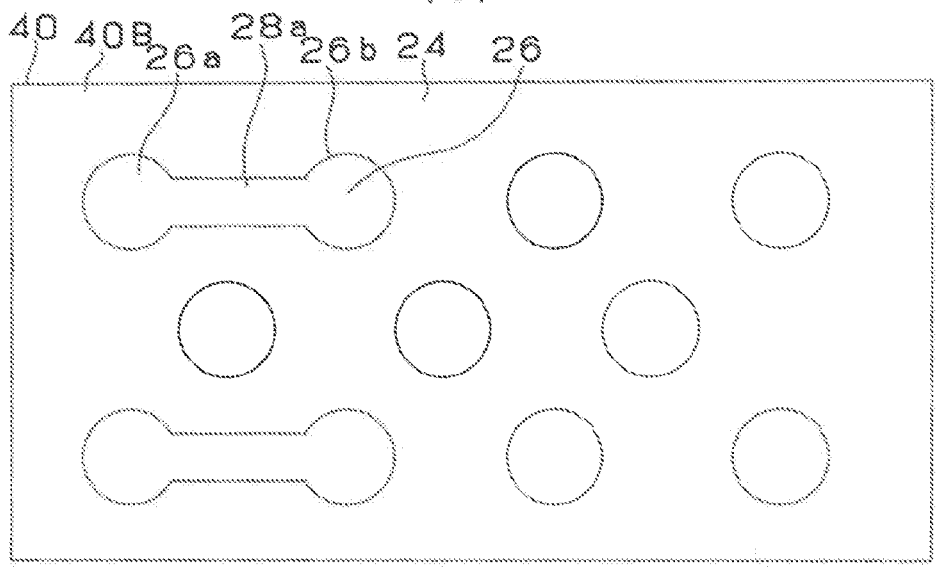

US 8,419,924 B2

WIRING SUBSTRATE AND METHOD FOR MANUFACTURING WIRING SUBSTRATE

TECHNICAL FIELD

The present invention relates to a wiring substrate having an insulative substrate made of a metal oxide and having a through-hole conductor that penetrates through the insulative substrate and is made of metal which forms the metal oxide, and to a method for manufacturing such a wiring substrate.

BACKGROUND ART

Patent Publication (1) discloses a method for forming a buildup layer on a core substrate having a conductive region and an insulative region. In Patent Publication (1), by oxidizing portions of aluminum, a core substrate is formed with aluminum (conductive region) and aluminum oxide (insulative region). In addition, Patent Publication (1) discloses that the insulative region of Patent Publication (1) is made up of a porous region and a non-porous region, and that the porous layer provides non-conductive features and the denser region works as a barrier layer which prevents the conductive region from being oxidized.
[Prior Art Publication]
[Patent Publication]
[Patent Publication 1] U.S. Pat. No. 6,899,815 B2

SUMMARY OF THE INVENTION

Problem(s) to be Solved by the Invention

However, since the insulative region of the core substrate in Patent Publication (1) has a porous region, if the core substrate in Patent Publication (1) is used as a wiring substrate, it is thought that the strength of such a wiring substrate will be low. Accordingly, it is assumed that the degrees of warping and bending may become greater in the wiring substrate. Also, it is assumed that water may seep into holes of the porous region, thus decreasing the insulation resistance of the wiring substrate.

The objective of the present invention is to improve the reliability of a wiring substrate containing a metal such as aluminum and its metal oxide, and to provide a manufacturing method by which the reliability of the wiring substrate will be improved.

Solution(s) to the Problem(s)

A wiring substrate according to the present invention has an insulative substrate having a first surface and a second surface opposite the first surface and being made of a metal oxide having holes, and through-hole conductors penetrating through the insulative substrate and being made of metal that forms the metal oxide. Filler is filled in the holes.

Also, a method for manufacturing a wiring substrate according to the present invention includes the following: forming a resist for anodic oxidation on the first surface of a metal plate having a first surface and a second surface opposite the first surface; forming a protective film on the second surface of the metal plate; immersing the metal plate in an anodic oxidation bath; from the first surface toward the second surface, oxidizing the metal of the metal plate exposed from the resist for anodic oxidation by using the metal plate as an anode; removing the resist for anodic oxidation; and removing the protective film.

BRIEF DESCRIPTION OF THE DRAWINGS

FIG. 2 cross-sectional views of a method for manufacturing a printed wiring board according to the embodiment of the present invention;

FIG. 4 FIG. 4(A) is a schematic view showing a cross section of a metal oxide having holes, FIG. 4(B) is a schematic view showing the surface taken at the b-b line in FIG. 4(A), and FIG. 4(C) is a schematic view showing a cross section of the metal oxide after a filler is filled;

FIG. 7 FIG. 7(A) is a microphotograph of aluminum oxide obtained by anodic oxidation in a solution containing a few percent of oxalic acid, and FIG. 7(B) is a microphotograph of aluminum oxide in the embodiment;

FIG. 8 FIG. 8(A) is a cross-sectional view of a wiring substrate according to the embodiment, FIG. 8(B) is a plan view of a first surface of the wiring substrate, and FIG. 8(C) is a plan view of a second surface of the wiring substrate;

FIG. 10 FIG. 10(A) is a cross-sectional view of a wiring substrate according to the modified embodiment of the present invention, and FIG. 10(B) is a plan view;

FIG. 15 a schematic view showing plugged holes of aluminum oxide caused by boiled water or the like.

BEST MODE TO CARRY OUT THE INVENTION

Figure 4:
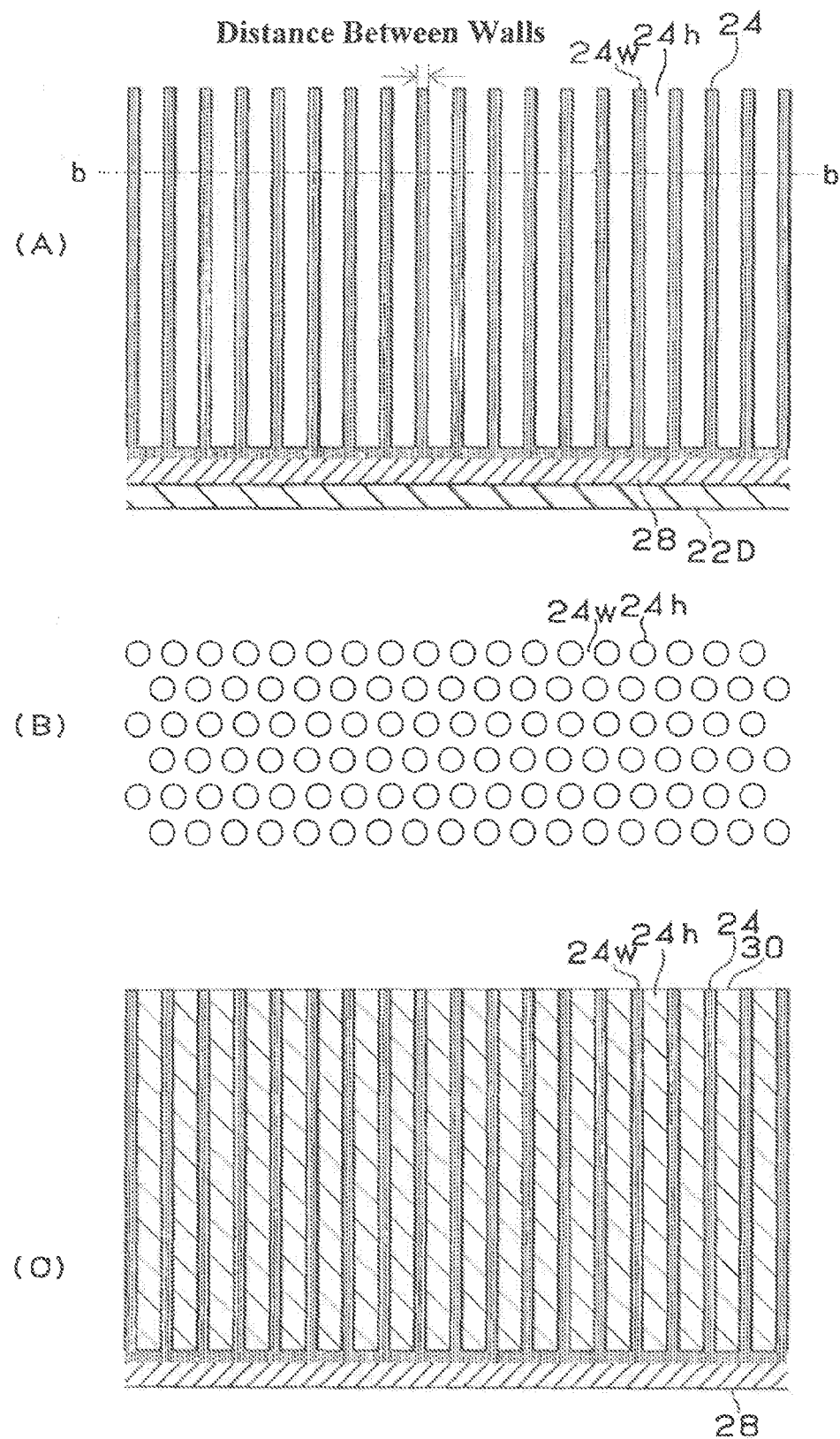
Figure 15:
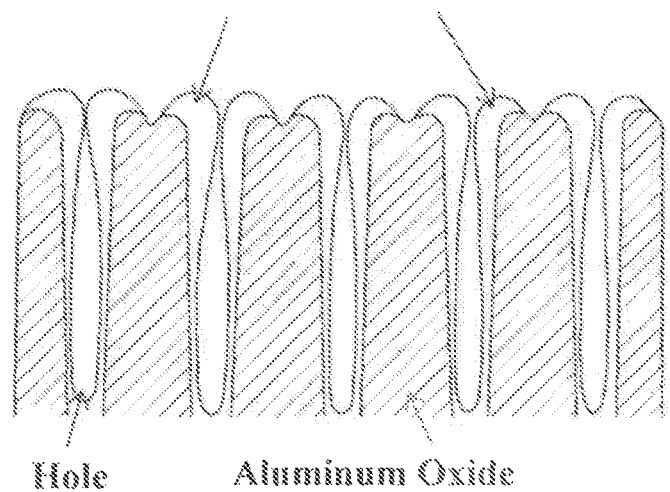

When aluminum is anodic oxidized, an aluminum plate is immersed in weak organic acid or inorganic acid, as shown in FIG. 4 of Patent Publication (1). Oxalic acid may be listed as a primary example of acids for anodic oxidation of aluminum. FIG. 7(A) shows a cross-sectional view of an aluminum plate which is anodic oxidized in an oxalic acid solution at a concentration of a few percent. As shown in FIG. 7(A), anodic oxidized portions (aluminum oxide) have holes inside. If there are holes in aluminum oxide, its corrosion resistance is low. Thus, a treatment to plug the holes is conducted. By keeping the anodic oxidized aluminum substrate in boiling water or in pressured steam, the walls of its holes will expand and the holes will be plugged. Since such expansion is assumed to progress more at the hole entrance than inside the hole, it is thought that FIG. 15 will show the way holes are plugged. In such situations, since space remains inside the anodic oxidized portions, strength will decrease in such portions. Moreover, it is thought that water will remain in the holes and insulation resistance may decrease.

[Embodiment]

A method for manufacturing a wiring substrate according to an embodiment of the present invention is described with reference to the drawings. Metal plate 20 is prepared as a starting material (FIG. 1(A)). As for such a metal plate, the following may be listed: aluminum plate, magnesium plate, titanium plate, zinc plate, tantalum plate, niobium plate, hafnium plate, zirconium plate, tungsten plate, bismuth plate, antimony plate, aluminum alloy plate, titanium alloy plate and magnesium alloy plate. Since aluminum is a lightweight metal for use as a metal plate, it is suitable as a material for a wiring substrate. A metal plate has first surface (20A) and second surface (20B) opposite the first surface. Resist is formed on both surfaces of metal plate 20. By exposing to light and developing the resist formed on first surface (20A), resist (22U) for anodic oxidation is formed in portions to form through-hole conductors. Resist (22U) for anodic oxidation formed on first surface (20A) is referred to as a first resist pattern. Portions directly under the first resist pattern are protected by the resist. Therefore, metals such as aluminum under the first resist pattern will seldom be oxidized even after the later-described anodic oxidation. Accordingly, the metal under the resist will remain as metal.

Figure 1:
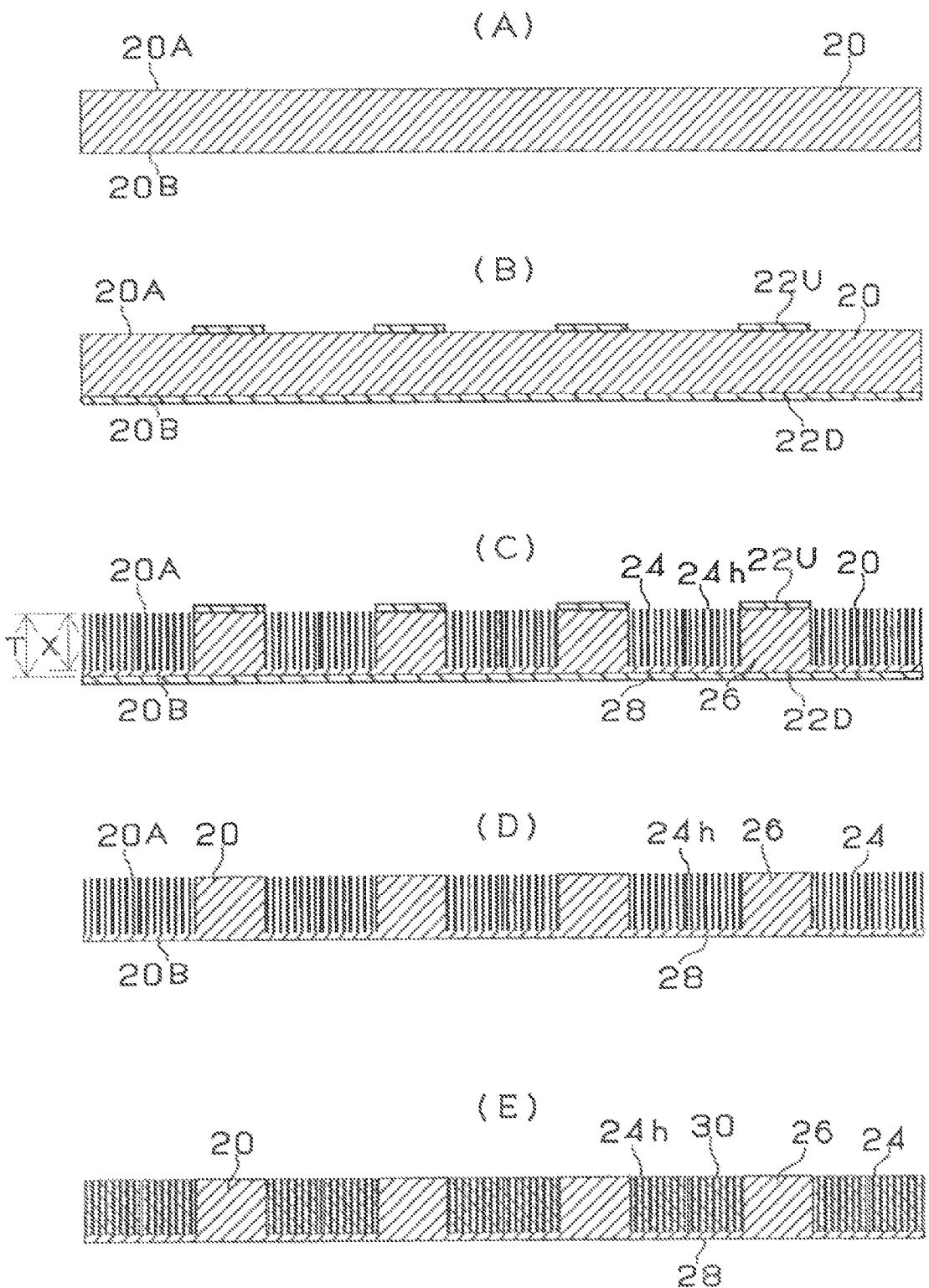
FIG. 1 cross-sectional views of a method for manufacturing a wiring substrate according to an embodiment of the present invention.

The resist formed on second surface (20B) covers the second surface (FIG. 1(B)). Namely, the resist on the second surface is not patterned. The resist formed on second surface (20B) is referred to as protective film (22D). By covering the second surface with resist, oxidation will not progress from the second surface toward the first surface. Oxidation will progress from the first surface toward the second surface.

In the following, a method for anodic oxidizing a metal plate is described using aluminum as an example.

By performing electrolysis using a metal plate as an anode, the metal exposed from first resist (22U) will be oxidized from first surface (20A) toward second surface (20B). Metal plate (aluminum plate) 20, on which first resist pattern (22U) and protective film (22D) are formed, and platinum plate 108 are immersed in anodic oxidation bath 100 shown below (see FIG. 3). Potassium titanium oxalate is preferred to be contained in a range of 20~80 g/l in a potassium titanium oxalate solution as an anodic oxidation bath. If the amount is in such a range, the density of a metal oxide formed through anodic oxidation will be in an appropriate range and the metal oxide will seldom expand. Electrolysis is performed under the following conditions using the metal plate as an anode and the platinum plate as a cathode. In other words, using a metal as an anode, the metal is oxidized. In the example shown in FIG. 3, a sheet of cathode was used. However, cathodes may be immersed in an anodic oxidation solution to sandwich the metal plate. Alternatively, electrodes chemically stable in an anodic oxidation solution, for example, gold, titanium and glassy carbon, may be used as the material for the cathode.

| potassium titanium oxalate | 20~80 g/l |
| bath temperature | 20~70° C. |
| time | 5 minutes to 24 hours |
| bath voltage | 80~200 V |
| current density | 1~3 A/dm2 |

The metal (aluminum) exposed from first resist pattern (22U) is converted to a metal oxide through anodic oxidation from first surface (20A) toward second surface (20B) (FIG. 1(C)). In the present embodiment, metal oxidation will not progress from both surfaces. Since the metal is oxidized from one of its surfaces, the diameter of later-described through-hole conductors may be made smaller. In addition, the pitch between through-hole conductors may be made narrower. If a metal is anodic oxidized from both of its surfaces, the resist pattern to be formed on the second surface of the metal plate is required to be formed facing the first resist pattern. If resist patterns for anodic oxidation are offset on the upper and lower surfaces of a metal plate, or the sizes are different, through-hole conductors tend to be oblique or substantially trapezoidal. It would be difficult to reduce the pitch between through-hole conductors. In a method for manufacturing a wiring substrate in the present embodiment, a potassium titanium oxalate solution is used for the anodic oxidation bath. Since a potassium titanium oxalate solution is highly capable of dissolving aluminum oxide formed by anodic oxidation, porous aluminum oxide will be formed. Holes with a greater hole diameter and a greater volume are formed in a metal oxide (aluminum oxide) obtained through anodic oxidation in the present embodiment. Thus, the volume will decrease in wall portions made of aluminum oxide. As a result, metal oxide such as aluminum oxide formed through anodic oxidation will seldom expand. Accordingly, the metal-oxide portions (insulative portions) such as aluminum oxide will not expand, and the substrate may be formed flat.

Figure 6:
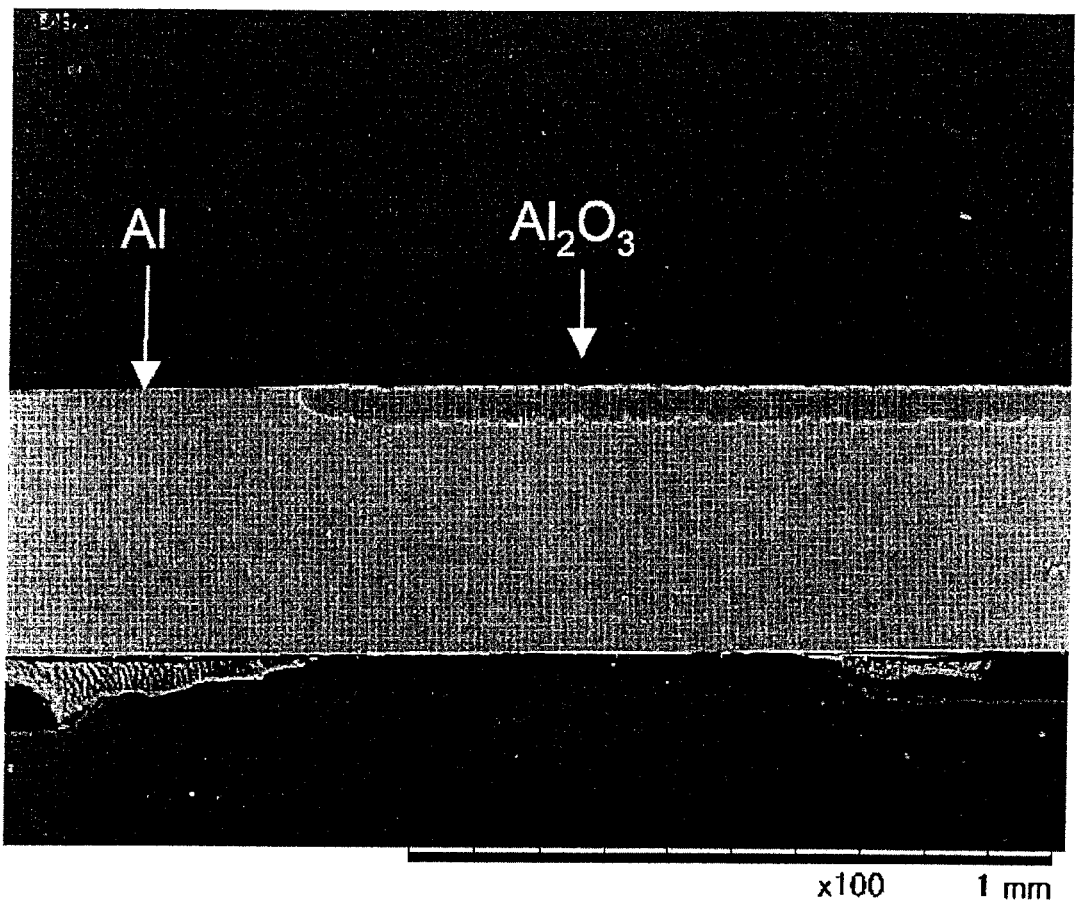
FIG. 6 a microphotograph of the aluminum oxide in the embodiment.

FIG. 6 is a microphotograph of aluminum oxide (Al2O3) obtained using the above bath and under the above conditions. As seen in the photograph, the upper surface of the aluminum oxide and the upper surface of the aluminum are positioned on substantially the same level. FIG. 7(B) is a magnified microphotograph of the aluminum oxide in FIG. 6. FIG. 7(A) is a microphotograph of aluminum oxide (reference example) obtained by using an anodic oxidation bath containing oxalic acid at a concentration of a few percent. If FIG. 7(A) and FIG. 7(B) are compared, it is found that the hole diameter of the aluminum oxide in the present embodiment is greater than the hole diameter in the reference example. If the volume of holes occupying space in the aluminum oxide is compared in the present embodiment and in the reference example, it is greater in the present embodiment than in the reference example. Here, the hole diameter indicates the maximum diameter obtained by slicing a hole with a plane parallel to the first surface. Also, if the distance from one wall to the other wall (distance between walls, see FIG. 4) of a metal oxide (aluminum oxide) is compared in the present embodiment and the reference example, it is smaller in the present embodiment than in the reference example. Namely, the density of aluminum oxide in the present embodiment is smaller than the density of aluminum oxide in the reference example. When a metal is oxidized to a metal oxide, its volume will increase. However, the metal oxide (aluminum oxide) of the present embodiment is dissolved more in an anodic oxidation bath than that of the reference example. Therefore, the upper surface of a metal oxide (aluminum oxide) and the upper surface of the metal (aluminum) tend to be positioned on substantially the same level.

In the present embodiment, anodic oxidation will be stopped before oxidation reaches second surface (20B) of metal plate 20. Thickness X of a metal oxide formed by anodic oxidation to thickness T of the metal plate is preferred to be 0.7~0.95 (X/T). In addition, (T-X) is preferred to be 5~35 μM Fine conductive circuits may be formed on the second surface of the insulative substrate.

FIG. 4(A) is a schematic view showing a cross section of a metal oxide (aluminum oxide) in the present embodiment. FIG. 4(B) shows a schematic view taken at the b-b line in FIG. 4(A). As described above, since holes (24h) with a greater diameter and a greater volume are formed, the relative volume of walls (24w) will become smaller. Aluminum oxide is formed on the bottoms of holes (24h). Furthermore, below the bottoms of the aluminum oxide, metal layer (aluminum layer) 28 remains where oxidation is prevented by resist (22D).

Figure 5:
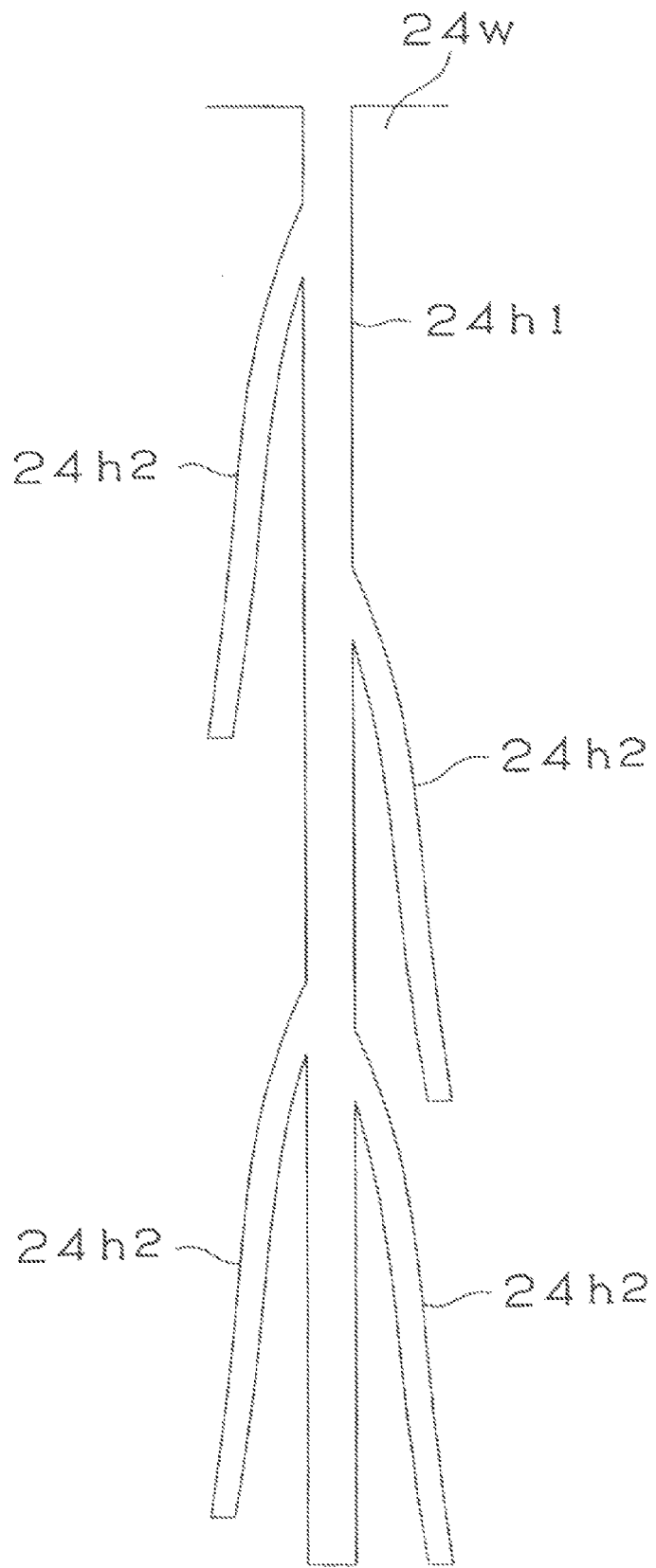
FIG. 5 a magnified view schematically showing a hole made of a primary hole and secondary holes.

FIG. 5 is a magnified schematic view showing a hole in the microphotograph in FIG. 7(B). Holes (24h) in the metal oxide are made up of primary hole (24h1) and secondary holes (24h2). Secondary holes are those branched off from the primary hole, and their lengths are shorter than that of the primary hole. If there are secondary holes, the volume of a metal oxide divided by (volume of holes in the metal oxide+ volume of the metal oxide) will be smaller than in situations in which a metal oxide does not have secondary holes. Volume expansion will be less when a metal is converted to a metal oxide. The volume of a metal oxide divided by (volume of holes in the metal oxide+volume of the metal oxide) is preferred to be 0.3~0.7.

In the following, a method for manufacturing a wiring substrate after anodic oxidation is described. From the substrate after anodic oxidation (see FIG. 1(C), first resist pattern (22U) and protective film (22D) are removed (see FIG. 1(D)).

Filler 30 is filled in holes (24h) in the metal oxide described above with reference to FIG. 4(A). FIG. 4(C) schematically shows how filler 30 is filled in holes (24h) in the metal oxide. By filling filler in the holes, the strength of the metal oxide will increase. The strength of the later-described insulative substrate will increase and the insulative substrate will seldom warp. Insulation reliability between through-hole conductors made of a metal forming the later-described metal oxide will become higher. The pitch between through-hole conductors may be made narrower.

Resin may be listed as an example of filler. If the later-described insulative substrate is made of a metal oxide and a resin, since the rigidity of the insulative substrate is enhanced, cracks will seldom occur in the insulative substrate. As for the resin, thermosetting resins, thermoplastic resins or their composite resins may be used. As for thermosetting resins, epoxy resin, phenol resin, polyimide resin or the like may be used. Also, as for thermoplastic resins, polyether sulfone (PES), polysulfone (PSF), polyphenylene sulfone (PPS), polyphenylene sulfide (PPES), polyphenylene ether (PPE), polyetherimide (PI), fluororesin or the like may be used. In the present embodiment, filler made of the above-described resin and inorganic particles may be filled in the holes in the metal oxide (aluminum oxide). As for inorganic particles, aluminum oxide (Al2O3), SiO2 (silicon dioxide), Si3N4 (silicon nitride) or the like may be used. Since the filler contains inorganic particles, the thermal expansion coefficient of the filler will decrease. Since the thermal expansion coefficient of the filler will become closer to that of the metal oxide such as aluminum oxide, the reliability of the insulative substrate against temperature change will increase.

The filler may be filled by the following method. For example, an impregnation solution is prepared by dissolving the above resin in a solution containing glycol ether (cellosolve) series, (ethyl) cellosolve, methyl cellosolve, butyl cellosolve or the like. If a filler contains inorganic particles, inorganic particles are dispersed in an impregnation solution to prepare an impregnation solution containing inorganic particles and resin. By applying or spraying the impregnation solution, film made of the impregnation solution is formed on a first surface (the surface where a metal and the metal oxide are exposed) of the substrate made of a metal such as aluminum and a metal oxide such as aluminum oxide (see FIG. 1(D)). The impregnation solution will be filled in the holes in the metal oxide by its own weight or through capillarity. Since the shape of the holes in the metal oxide that forms the insulative substrate is long in the cross-sectional direction and short in the surface direction of the insulative substrate, it is easier to fill the holes with the filler. After that, the solvent is removed by heating or the like. If it is difficult to complete filling by one treatment, then the above treatment may be repeated multiple times.

Ceramics may also be used as filler. Since the later-described thermal expansion coefficient of the insulative substrate becomes closer to that of an electronic component, connection reliability will be enhanced between the electronic component and the wiring substrate of the present embodiment. If ceramics are used, the filler may be filled by a sol-gel method. As for ceramics, glass, titanium oxide or the like may be used.

After the filler is filled, the surface where the metal oxide is exposed (first surface) (20A) is polished and the filler on the metal and the metal oxide is removed (FIG. 1(E)). By CMP polishing (chemical-mechanical polishing), the upper surface of the metal and the upper surface of the metal oxide may become flat.

Etching resist with a predetermined pattern (Photec H-6200, made by Hitachi Chemical Co., Ltd.) is formed on lower-surface side metal layer 28 (aluminum layer). The portions where the etching resist is not formed are etched away and the etching resist is removed to form conductive circuits (28a). If a metal plate is aluminum, hydrochloric acid or potassium hydrate may be used for an etching solution. Accordingly, wiring substrate 40 is completed (FIG. 2(A)). As shown in FIGS. 8(A), 8(B) and 8(C), wiring substrate 40 has insulative substrate 40 having first surface (40A) and second surface (40B) opposite the first surface, through-hole conductors 26 penetrating through the insulative substrate, and conductive circuits (28a) formed on second surface (40B) of the insulative substrate. The insulative substrate is made of metal oxide 24 having holes (24h), and filler 30 is filled in holes (24h). The insulative substrate is made of the metal oxide and the filler. Also, through-hole conductors 26 electrically connect first surface (40A) and second surface (40B) of insulative substrate 40, and are made of metal that forms the metal oxide. Conductive circuits (28a) formed on the second surface are made of metal that forms the metal oxide. Therefore, fine conductive circuits may be formed since adhesive strength is high between the insulative substrate and the conductive circuits. In addition, conductive circuits (28a) formed on second surface (40B) are made of the same metal as that of the through-hole conductors. FIG. 8(A) is a cross-sectional view of the wiring substrate, FIG. 8(B) is a plan view seen from the first-surface side of the insulative substrate, and FIG. 8(C) is a plan view seen from the second-surface side of the insulative substrate. The first surface of the insulative substrate is exposed. Wiring substrate 40 does not have conductive circuits which are made of metal that forms the metal oxide on the first surface of the insulative substrate made of the metal oxide and filler. Also, the wiring substrate may include external connection terminals (26a) and through-hole lands (26b) on second surface (40B) of the insulative substrate. External connection terminals are connected to through-hole conductors through conductive circuits. In the present embodiment, since the wiring substrate is formed by anodic oxidation, it is easy to form metallic through-hole conductors. The resistance of through-hole conductors will decrease.

Solder-resist layers 38 having openings (38a) are preferred to be formed on both surfaces of wiring substrate 40. Nickel-plated layer 32 and gold-plated layer 34 may be formed on conductive circuits, through-hole conductors and external connection terminals exposed through openings (38a) in the solder-resist layers (FIG. 2(B)). Since valve metals such as aluminum are seldom oxidized, oxidation preventive film such as a gold-plated layer is not required to be formed on conductive circuits exposed through the openings in the solder-resist.

Solder paste is applied in openings (38a) in upper-surface and lower-surface solder-resist layers of wiring substrate 40, and is then reflowed to form solder bumps (28U) on the upper-surface side and solder bumps (28D) on the lower-surface side (FIG. 2(C)).

[Modified Embodiments]

Modified embodiments (1) and (2) of the above embodiment are shown in the following. In the above embodiment, conductive circuits are made from the second-surface side metal of a metal plate (metal layer 28). In modified embodiments (1) and (2), a second-surface side metal (metal layer 28) is removed by polishing. Metal oxide will be exposed.

Figure 9:
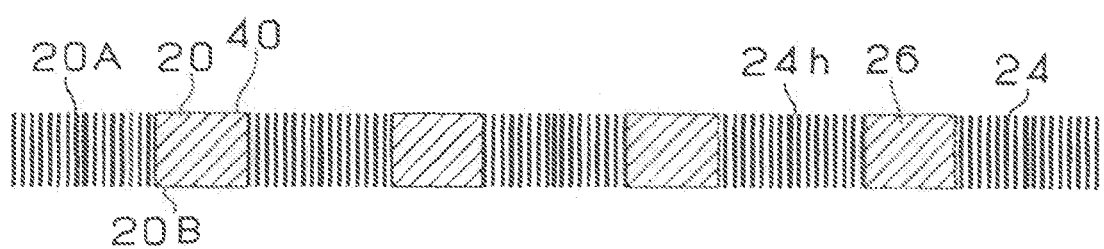
FIG. 9 a cross-sectional view of a wiring substrate according to a modified embodiment.

In modified embodiment (1), metal layer 28 (the metal on second surface (20B) of metal plate 20) is removed from an unfinished substrate shown in FIG. 1(D). Circuit substrate 40 is completed, having an insulative substrate made of metal oxide 24 with holes as well as through-hole conductors 26 made of metal penetrating through the insulative substrate (FIG. 9). Then, filler is filled in the holes of the metal oxide. In modified example (1), film made from an impregnation solution may be formed on both surfaces of the circuit substrate. It is also an option to form film made from the impregnation solution on either surface of the circuit substrate, the same as in the embodiment.

Figure 10:
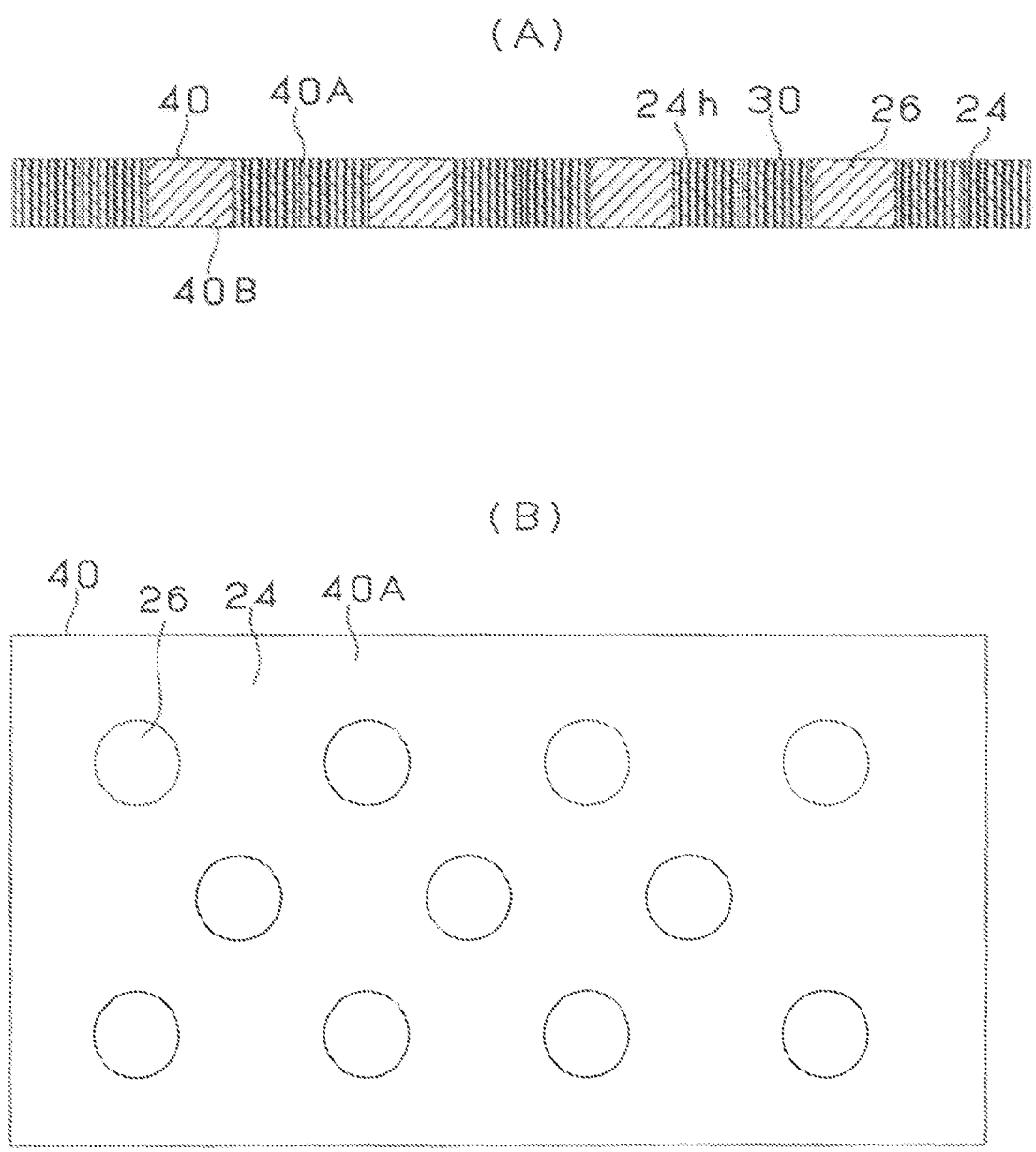

Accordingly, a wiring substrate is completed (FIGS. 10(A), 10(B)). FIG. 10(A) is a cross-sectional view and FIG. 10(B) is a plan view. Wiring substrate 40 has an insulative substrate having first surface (40A) and second surface (40B) opposite the first surface and through-hole conductors 26 penetrating through the insulative substrate. The insulative substrate is made of metal oxide 24 having holes (24h), and filler 30 is filled in the holes. The insulative substrate is made of the metal oxide and the filler. Also, the through-hole conductors electrically connect the first surface and the second surface of the insulative substrate, and are made of metal that forms the metal oxide.

In modified embodiment (2), metal layer 28 (the metal on a second-surface side of a metal plate) is removed from an unfinished substrate shown in FIG. 1(E). Accordingly, a wiring substrate is completed (FIGS. 10(A), 10(B)). Wiring substrate 40 has an insulative substrate having first surface (40A) and second surface (40B) opposite the first surface as well as through-hole conductors 26 that penetrate through the insulative substrate. The insulative substrate is made of metal oxide 24 having holes (24h), and filler 30 is filled in the holes. The insulative substrate is made of a metal oxide and filler. Also, the through-hole conductors electrically connect the first surface and second surface of the insulative substrate, and are made of metal that forms the metal oxide.

[Another Embodiment]

In the above-described embodiment, resist for anodic oxidation is formed on a first surface of a metal plate. Resist for anodic oxidation may be formed on both surfaces of a metal plate. In the following, such an example (another embodiment) is shown.

Figure 11:
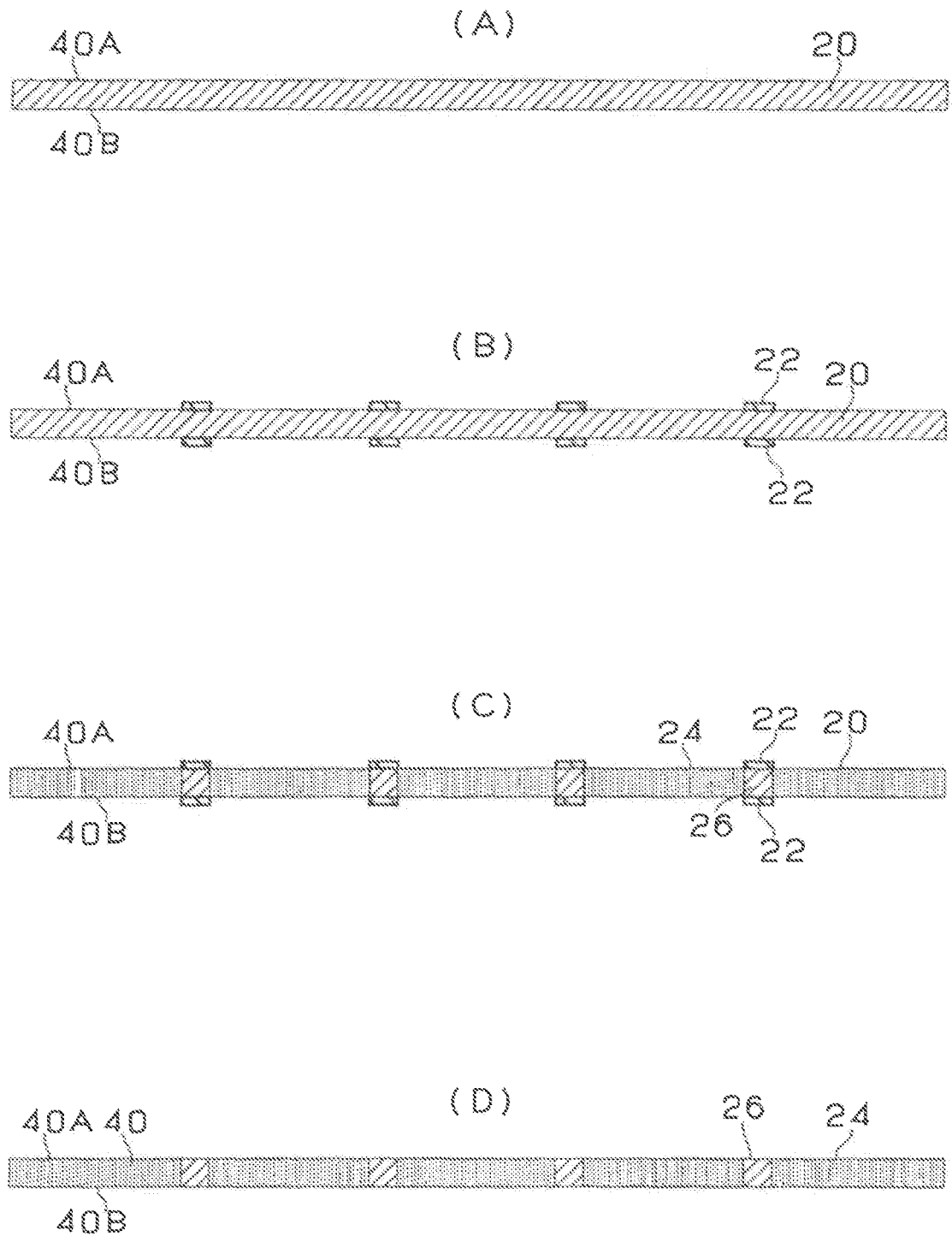
FIG. 11 cross-sectional views showing a method for manufacturing a wiring substrate according to another embodiment of the present invention.

As shown in FIG. 11(A), resist (brand number: Photec H-6200, made by Hitachi Chemical Co., Ltd.) is formed on first surface (40A) and second surface (40B) of metal plate 20. Through exposure to light and development, resists 22 for anodic oxidation are formed on portions to form through-hole conductors (FIG. 11(B)). The resist for anodic oxidation formed on first surface (40A) is a first resist pattern and the resist for anodic oxidation formed on second surface (40B) is a second resist pattern. As shown in FIG. 11(B), first and second resist patterns are formed to face each other. Then, the same as in the above-described embodiment, the metal exposed from the first and second resist patterns are anodic oxidized to form metal oxide 24 (FIG. 11(C)). After that, first and second resist patterns are removed (FIG. 11(D)). Circuit substrate 40 is completed, having an insulative substrate made of metal oxide 24 with holes and through-hole conductors 26 penetrating through the insulative substrate (FIG. 11(D)). Circuit substrate 40 in FIG. 11(D) has first surface (40A) and second surface (40B) opposite the first surface. Next, filler is filled in the holes in the metal oxide. The same method as in the above-described embodiment may be employed for filling the filler.

By polishing the first and second surfaces of the circuit substrate, the filler on the circuit substrate is removed. A wiring substrate is completed, being made of an insulative substrate and through-hole conductors that penetrate through the insulative substrate (FIG. 10(A)). The same as in the above-described embodiment, filler is filled in the holes in the metal oxide. FIG. 10(B) is a plan view seen from the first-surface side of the wiring substrate.

In the other embodiment, conductive circuits made of metal that forms the metal oxide are not formed on the second surface of the insulative substrate made of the metal oxide. Since the upper and lower surfaces are well balanced in the other embodiment, the wiring board of the other embodiment tends to be flat.

FIRST EXAMPLE

A method for manufacturing a wiring substrate according to the first example of the present invention is described with reference to the drawings. In the first example, 100 μm-thick aluminum plate 20 (made by Nippon Light Metal Co., Ltd., 99.99 or greater wt. % purity) is used as a starting material (FIG. 1(A)). The aluminum plate has a first surface and a second surface opposite the first surface. Resist (brand name: Photec H-6200, made by Hitachi Chemical Co., Ltd.) is formed on both surfaces of aluminum plate 20. By exposing to light and developing the resist formed on first surface (20A), resist (22U) for anodic oxidation is formed in portions to form through-hole conductors. Protective film (22D) formed on the second surface covers second surface (20B) (FIG. 1(B)).

Figure 3:
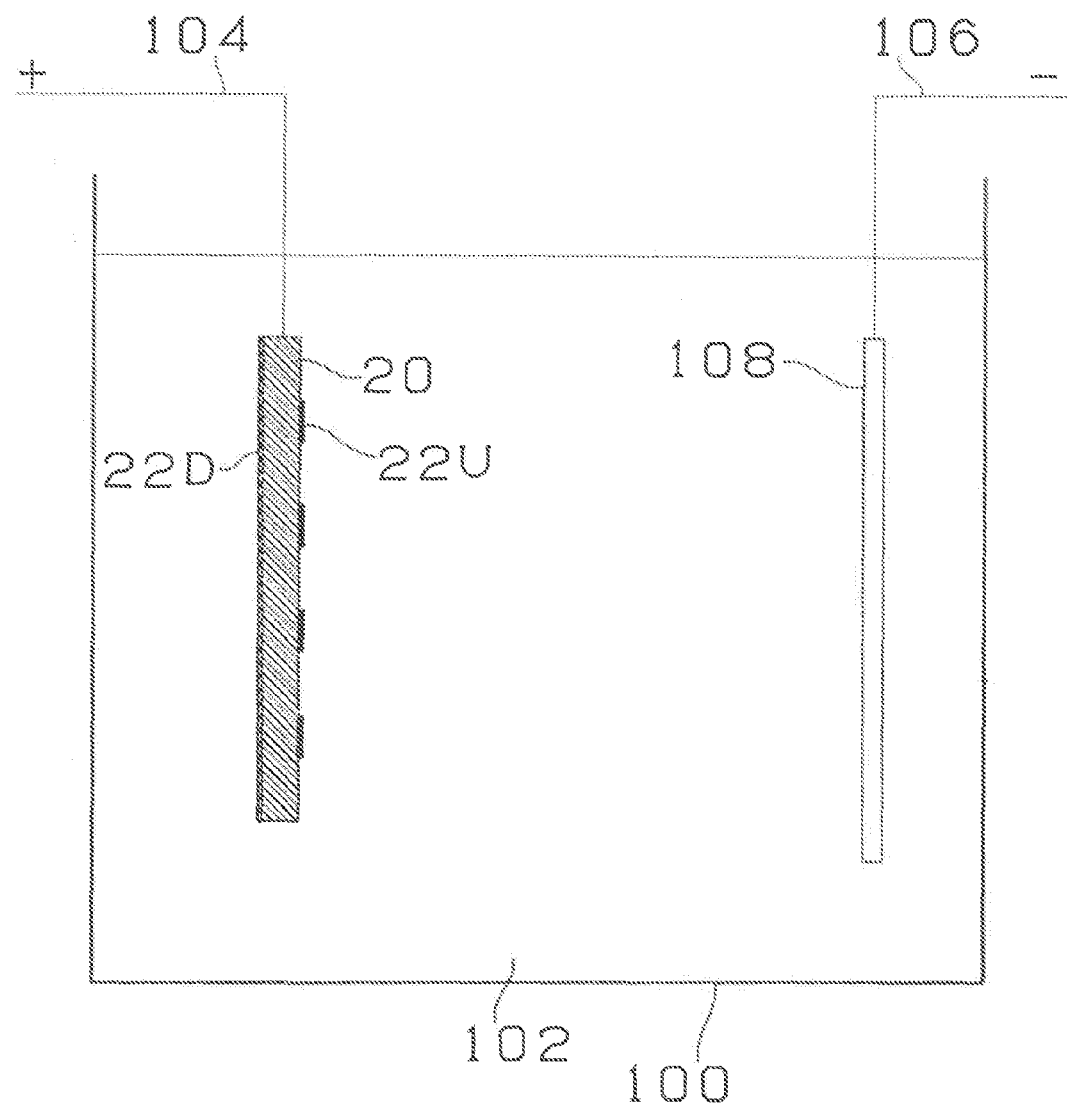
FIG. 3 a view to illustrate an anodic oxidation bath.

In the following anodic oxidation bath 100, aluminum plate 20, where first resist pattern (22U) and protective film (22D) are formed, and platinum plate 108 are immersed (see FIG. 3). Using the aluminum plate as an anode and the platinum plate as a cathode, electrolysis is performed under the following conditions.

| | |
|---|---|
| potassium titanium oxalate dihydrate | 40 g/l |
| citric acid monohydrate | 1 g/l |
| oxalic acid dihydrate | 1.2 g/l |
| boric acid | 8 g/l |
| bath temperature | 20° C. |
| time | 180 minutes |
| bath voltage | 120 V |
| current density | 3 A/dm2 |

Through anodic oxidation, the aluminum exposed from first resist pattern 22 is converted to aluminum oxide from first surface (20A) toward second surface (20B) (FIG. 1(C)). In the method for manufacturing a wiring substrate according to the first example, since a potassium titanium oxalate solution is used for an anodic oxidation bath, porous aluminum oxide is formed. Since holes with a greater diameter and a greater volume are formed in aluminum oxide obtained by anodic oxidation, the volume will decrease in the wall portions formed with the aluminum oxide. As a result, the aluminum oxide formed by anodic oxidation will seldom expand. Accordingly, portions of aluminum oxide (insulative portions) will not expand, and a flat substrate may be formed.

In the first example, anodic oxidation is stopped before anodic oxidation reaches the second surface. The thickness of aluminum oxide formed by anodic oxidation is 70 μm (the thickness of the aluminum layer=30 μm). Namely, 30 μm-thick aluminum on the second-surface side of the metal plate will not be oxidized. The volume of aluminum oxide divided by (volume of holes in aluminum oxide+volume of aluminum oxide) is approximately 40.

Next, a method for manufacturing a wiring substrate after anodic oxidation is described. From the substrate after anodic oxidation (see FIG. 1(C)), first resist pattern (22U) and protective film (22D) are removed (see FIG. 2(D)).

In holes (24h) in aluminum oxide described above with reference to FIG. 4(A), filler 30 made of thermosetting epoxy resin is filled. In the following, a method for filling a filler is described. An impregnation solution is prepared by mixing epoxy resin (series number 871, made by JER) and xylene in a ratio of 1:9. The impregnation solution is applied on first surface (20A) (the surface where aluminum and aluminum oxide are exposed) of a substrate (see FIG. 1(D)) made of aluminum and aluminum oxide. After waiting until the impregnation solution seeps into the holes in the aluminum oxide, the substrate is dried and the solvent is removed.

After filling the filler, surface (20A) (first surface) where aluminum oxide is exposed is polished to remove the filler on the aluminum and aluminum oxide (FIG. 1(E)).

Etching resist with a predetermined pattern is formed on lower-surface side aluminum layer 28. Aluminum layer 28 exposed from the etching resist is etched away (etching solution: 40° C., containing 6% hydrochloric acid) and the etching resist is removed to form conductive circuits (28a). Accordingly, wiring substrate 40 is completed (FIG. 2(A)). The insulative substrate of wiring substrate 40 in the first example is made of aluminum oxide having holes, and epoxy resin is filled in the holes. The insulative substrate is made of epoxy resin and aluminum oxide, and through-hole conductors penetrating the insulative substrate are made of aluminum. Conductive circuits (26a) formed on second surface (40B) of the insulative substrate are made of aluminum.

Solder-resist layers 38 having openings (38a) are preferred to be formed on both surfaces of wiring substrate 40. Nickel-plated layer 32 and gold-plated layer 34 may be formed on conductive circuits, through-hole conductors and external connection terminals exposed through openings (38a) in the solder-resist layers (FIG. 2(B)).

Solder paste is applied in openings (38a) in upper-surface and lower-surface solder-resist layers of wiring substrate 40, and is then reflowed to form solder bumps (28U) on the upper-surface side and solder bumps (28D) on the lower-surface side (FIG. 2(C)).

In a method for manufacturing a wiring substrate of the first example, resist for anodic oxidation (first resist pattern) is formed on the upper surface (first surface) of aluminum plate 20, and resist (protective film) (22D) is formed on the entire lower surface (second surface). Since a protective film is formed on the second surface of the aluminum plate, oxidation will not progress from the second surface. Namely, in the present embodiment, oxidation will progress from the first surface of the aluminum plate toward the second surface. In addition, since anodic oxidation is stopped before the anodic oxidized film reaches the second surface of the aluminum plate, circuits may be formed from the metal (metal layer 28) on the second-surface side of the aluminum plate. When the first resist pattern is formed, it is optional not to remove a cover film (Mylar) laminated on a surface of the protective film. When circuits are formed on the second surface, another resist is not required to be formed.

SECOND EXAMPLE

The second example is the same as the first example except for the amount to be anodic oxidized. In the second example, the amount to be anodic oxidized is greater than that in the first example. The thickness of aluminum oxide to be formed through anodic oxidation is 95 μm (the thickness of the aluminum layer=5 μm). Namely, the thickness of conductive circuits made from the aluminum formed on the second surface of insulative substrate 24 is 5 μm.

THIRD EXAMPLE

In the third example, filler made of resin and inorganic particles is used. In particular, an impregnation solution made of epoxy resin, silica particles and xylene (1:1:8 (weight ratio)) is used. Filler made of epoxy resin and silica particles is filled in the holes. The proportion of the filler is 1:1 by weight. Except for the above, the second example is the same as the first example.

FOURTH EXAMPLE

In the fourth example, filler made of ceramics is used. In particular, silica is filled in the holes in aluminum oxide using a sol-gel method. Except for that, the fourth example is the same as the first example.

FIFTH EXAMPLE

In the fifth example, a titanium plate is used as a starting material (plate thickness 100 um). The bath and conditions for anodic oxidizing titanium are shown as follows.
(Anodic Oxidation Bath)
a mixed solution of sulfuric acid 0.2 M and phosphoric acid 0.2 M
(Oxidation Conditions)
voltage: 250V
time: 7 hours
(An Etching Solution for Titanium Layer 28 and Etching Conditions)
an HF-HNO3 mixed solution (hydrogen fluoride: nitric acid: water=1:1:3)
at 25° C. for 10 minutes
Except for the above, the fifth example is the same as the first example.

SIXTH EXAMPLE

In the sixth example, a metal plate made of magnesium alloy (AZ91) is used as a starting material (plate thickness 100 um). The bath and conditions for anodic oxidizing the magnesium alloy are shown as follows.
(Anodic Oxidation Bath)
ammonium sulfate: 30 g/l
sodium dichromate dihydrate: 30 g/l
ammonia: little
50° C.

time: one hour
(An Etching Solution for the Magnesium-Alloy Layer and Etching Conditions)
  a solution containing 5% phosphoric acid
  25° C. for 10 minutes
Except for the above, the sixth example is the same as the first example

SEVENTH EXAMPLE

In the seventh example, 50 μm-thick aluminum plate 20 (made by Nippon Light Metal Co., Ltd., 99.99 wt. % purity) is used as a starting material. After a first resist pattern is formed, the substrate is immersed in a mixed solution (70° C.) of sulfuric acid 10 wt. % and nitric acid 10 wt. % for 120 seconds. Tunnel etching progresses in the aluminum exposed from the first resist pattern, and fine holes with an approximate depth of 40 um are formed in the aluminum plate. Then, the resist pattern is removed using a 10% ethanolamine solution, and atmospheric-pressure microwave plasma is irradiated on the aluminum plate from the first-surface side. Since the aluminum surface exposed through the holes formed by tunnel etching is active, it tends to be converted to aluminum oxide by oxygen plasma. By contrast, since the aluminum surface to be exposed by removing the first resist pattern is low in activity, oxidation will hardly progress. The aluminum plate is fixed to the XY table of the following apparatus. The thickness of aluminum layer 28 is 10 μm. Except for the above, the seventh example is the same as the first example.
(Oxygen Plasma Discharging Apparatus)
atmospheric-pressure microwave plasma systems (Nihon Plasmatreat Inc.) apparatus 1RD1004+FG3001

| (oxygen plasma discharging conditions) | |
|---|---|
| oxygen flow | 20 l/min |
| oscillating frequency | 20 KHz |
| output voltage | 220 V |
| current value | 2.9 A |
| moving speed of nozzle | 0.5 m/min |
| distance between nozzle and material | 4 mm |

[Applied Example of the Embodiment]

Figure 12:
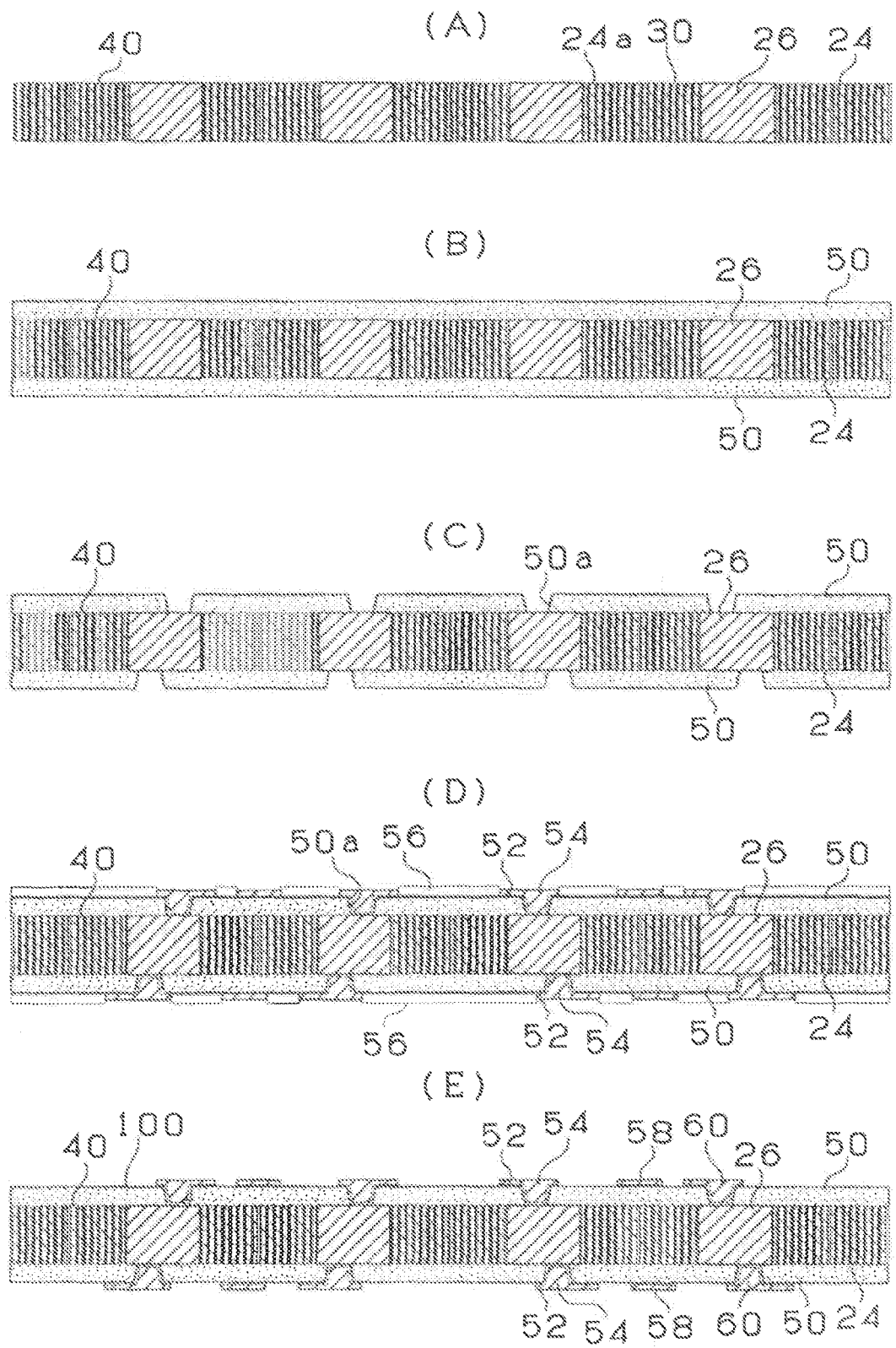
FIG. 12 cross-sectional views showing a method for manufacturing a wiring substrate according to an applied example of the embodiment of the present invention.

An applied example of the embodiment is described with reference to FIG. 12. In the applied example of the embodiment, buildup layers are formed on wiring substrate 40 (see FIGS. 10(A), 10(B)) obtained in the modified embodiments or another embodiment.

On both surfaces of wiring substrate 40, resin film for interlayer resin insulation layers (brand name: ABF-45SH, made by Ajinomoto) is laminated using a vacuum laminator. Then, resin insulation layers 50 are formed on wiring substrate 40 through thermosetting (FIG. 12(B)).

Next, using a CO2 gas laser, via-hole openings (50*a*) reaching through-hole conductors are formed in resin insulation layers 50 (FIG. 12(C)).

Next, surfaces of resin insulation layers (50*a*) including the inner walls of via-hole openings (50*a*) are roughened (not shown in the drawings). Such a roughening process is not always required.

The substrate after roughening treatment is immersed in a neutralizer (made by Shipley LLP) and washed with water. Then, a catalyst is attached to the substrate surfaces.

Next, the substrate is immersed in an electroless copper-plating solution to form 0.3~3.0 μm-thick electroless copper-plated films 52 on the surfaces of interlayer resin insulation layers 50 including the inner walls of via-hole openings (50*a*). Photosensitive dry film is laminated on electroless copper-plated films 52, exposed to light and developed to form plating resists 56. Then, electrolytic copper-plated films 54 with an approximate thickness of 15 μm are formed in portions where plating resist 56 is not formed (FIG. 12(D)).

Figure 13:
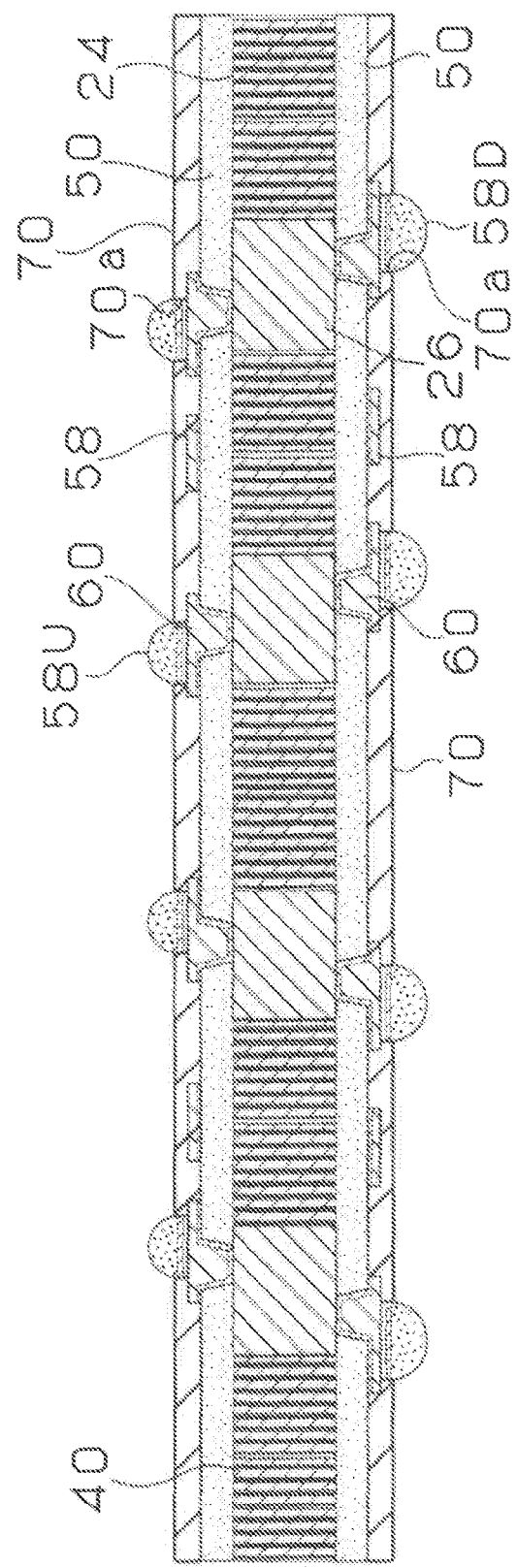
FIG. 13 a cross-sectional view of a wiring substrate according to the applied example of the embodiment of the present invention.

Next, plating resists 56 are removed by a 5% KOH solution. Then, the electroless plated films left exposed by the electrolytic copper-plated film are dissolved and removed. Accordingly, independent conductive circuits 58 and via conductors 60 are formed (FIG. 12(E)). Buildup wiring board 100 is completed (FIG. 12(E)). Solder-resist layers with openings to expose conductive circuits and via holes may be formed on both surfaces of buildup wiring board 100. Solder bumps may be formed in the openings in solder-resist layers. A printed wiring board having solder-resist layers 70 and solder bumps (58U, 58D) is shown in FIG. 13.

Since the first and second surfaces of a wiring substrate obtained by the modified embodiments or another embodiment are made flat, such a wiring board is suitable for a core substrate in a buildup wiring board. Fine via holes and conductive circuits may be formed.

[Applied Example (2) of the Embodiment]

Figure 14:
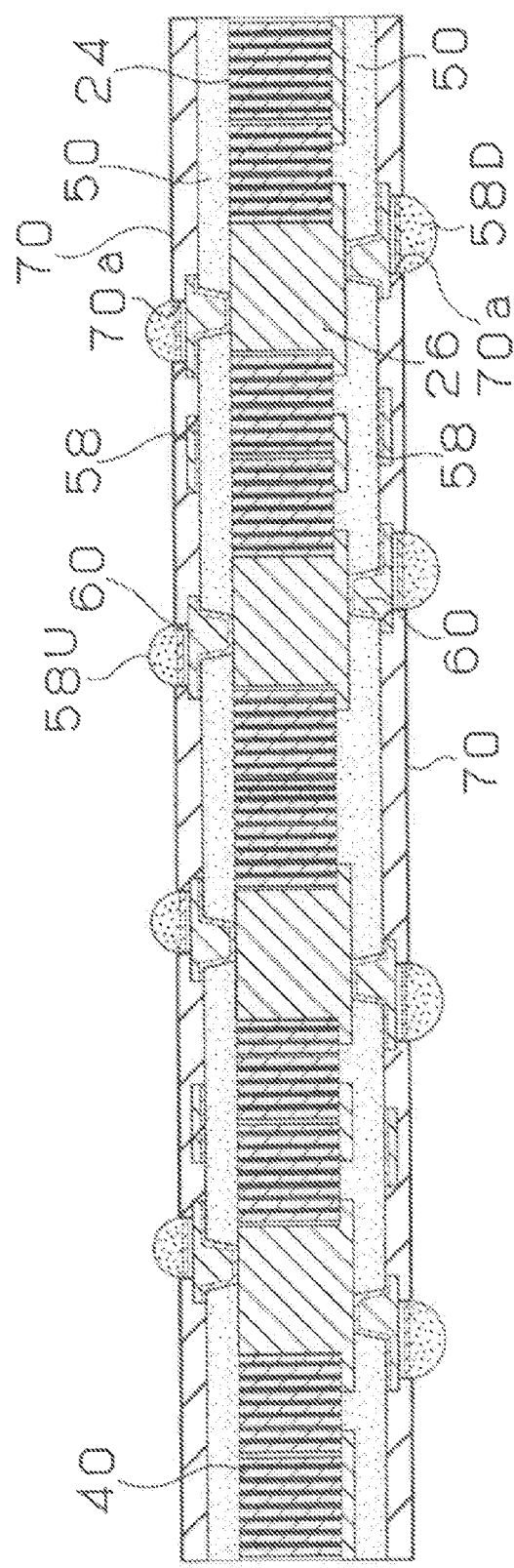
FIG. 14 a cross-sectional view of a wiring substrate according to applied example (2) of the embodiment of the present invention.

In applied example (2), buildup layers are formed on an insulative substrate of the embodiment. The formation method is the same as in the applied example of the embodiment. A buildup wiring board obtained by forming buildup layers on an insulative substrate of the embodiment is shown in FIG. 14. In applied example (2), since insulative substrate 40 contains conductive circuits (28*a*), a compact buildup wiring board may be formed.

The contents of Japanese Patent Application No. 2009-155402 is incorporated herein in its entirety in this application.

DESCRIPTION OF NUMERICAL REFERENCES

20 aluminum plate
22 resist
24 insulative portion (aluminum oxide)
24*h* hole
26 through hole
28U, 28D solder bump
30 filling resin
40 wiring substrate

The invention claimed is:
1. A method for manufacturing a wiring substrate, comprising:
  forming a resist for anodic oxidation on the first surface of a metal plate having a first surface and a second surface on an opposite side of the first surface of the metal plate;
  forming a protective film on the second surface of the metal plate;
  immersing the metal plate in an anodic oxidation bath;
  oxidizing the metal plate serving as an anode in the anodic oxidation bath such that a portion of the metal plate exposed from the resist is oxidized from the first surface toward the second surface and the metal plate retains a metal layer forming the second surface of the metal plate;
  removing the resist for anodic oxidation from the first surface of the metal plate; and
  removing the protective film from the metal layer formed on the second surface of the metal plate.
2. The method for manufacturing a wiring substrate according to claim 1, wherein the oxidizing of the metal plate comprises forming an insulative substrate comprising a metal oxide portion and a through-hole conductor comprising a metal portion.

3. The method for manufacturing a wiring substrate according to claim 2, further comprising forming a conductive circuit comprising a portion of the metal layer on the second surface of the metal plate.

4. The method for manufacturing a wiring substrate according to claim 1, further comprising forming a conductive circuit comprising a portion of the metal layer on the second surface of the metal plate.

5. The method for manufacturing a wiring substrate according to claim 1, wherein the anodic oxidation bath is a solution comprising at least one of potassium titanium oxalate, chromic acid, sulfuric acid and sodium hydroxide.

6. The method for manufacturing a wiring substrate according to claim 1, further comprising forming on the first surface of the metal plate a film of an impregnation solution comprising a filler such that the impregnation solution fills holes formed in the metal plate by the anodic oxidation.

7. The method for manufacturing a wiring substrate according to claim 1, wherein the further comprising applying on the first surface of the metal plate an impregnation solution comprising a filler such that a film of the impregnation solution is formed on the first surface of the metal plate.

8. The method for manufacturing a wiring substrate according to claim 1, wherein the metal plate is made of a metal selected from the group consisting of aluminum, magnesium, titanium zinc, tantalum, niobium, hafnium, zirconium, tungsten, bismuth and antimony.

9. The method for manufacturing a wiring substrate according to claim 1, further comprising spraying on the first surface of the metal plate an impregnation solution comprising a filler such that a film of the impregnation solution is formed on the first surface of the metal plate.

10. The method for manufacturing a wiring substrate according to claim 1, further comprising forming on the first surface of the metal plate a film of an impregnation solution comprising a filler such that the impregnation solution fills holes formed in the metal plate by the anodic oxidation, wherein the filler comprises a resin.

11. The method for manufacturing a wiring substrate according to claim 1, further comprising forming on the first surface of the metal plate a film of an impregnation solution comprising a filler such that the impregnation solution fills holes formed in the metal plate by the anodic oxidation, wherein the filler comprises a resin and inorganic particles.

12. The method for manufacturing a wiring substrate according to claim 1, further comprising forming on the first surface of the metal plate a film of an impregnation solution comprising a filler such that the impregnation solution fills holes formed in the metal plate by the anodic oxidation, wherein the filler comprises a ceramic material.

13. The method for manufacturing a wiring substrate according to claim 1, further comprising polishing the second surface of the metal plate such that the metal layer is removed from the metal plate.

14. The method for manufacturing a wiring substrate according to claim 1, further comprising:
    forming on the first surface of the metal plate a film of an impregnation solution comprising a filler such that the impregnation solution fills holes formed in the metal plate by the anodic oxidation; and
    polishing the first surface of the metal plate such that the filler remaining on the first surface of the metal plate is removed.

15. The method for manufacturing a wiring substrate according to claim 1, further comprising filling holes formed in the metal plate by the anodic oxidation with a ceramic material, wherein the ceramic material is filled by a sol-gel method.

16. The method for manufacturing a wiring substrate according to claim 1, wherein the metal oxide is made of aluminum, and the oxidizing of the metal plate satisfies X/T in a range from 0.7 to 0.95 and T-X in a range from 5 to 35 μm, where X represents a metal oxide formed by the anodic oxidation and T represents a thickness of the metal plate.

* * * * *